United States Patent
Zhao et al.

(10) Patent No.: US 12,204,827 B2
(45) Date of Patent: Jan. 21, 2025

(54) METHOD FOR ESTABLISHING ELECTROCHEMICAL MODEL FOR ION BATTERY

(71) Applicant: Shanghai Makesens Energy Storage Technology Co., Ltd., Shanghai (CN)

(72) Inventors: Enhai Zhao, Shanghai (CN); Xiao Yan, Shanghai (CN); Xiaohua Chen, Shanghai (CN); Danfei Gu, Shanghai (CN); Pingchao Hao, Shanghai (CN); Pei Song, Shanghai (CN); Peng Ding, Shanghai (CN); Weikun Wu, Shanghai (CN)

(73) Assignee: SHANGHAI MAKESENS ENERGY STORAGE TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 18/562,340

(22) PCT Filed: May 30, 2023

(86) PCT No.: PCT/CN2023/097220
§ 371 (c)(1),
(2) Date: Nov. 20, 2023

(87) PCT Pub. No.: WO2023/246445
PCT Pub. Date: Dec. 28, 2023

(65) Prior Publication Data
US 2024/0273258 A1    Aug. 15, 2024

(30) Foreign Application Priority Data
Jun. 24, 2022  (CN) .............................. 202210727081

(51) Int. Cl.
*G06F 30/20*      (2020.01)
*G06F 17/12*      (2006.01)
(Continued)

(52) U.S. Cl.
CPC ............. *G06F 30/20* (2020.01); *G06F 17/12* (2013.01); *H01M 4/661* (2013.01);
(Continued)

(58) Field of Classification Search
CPC ......... H01M 10/0525; H01M 10/0583; H01M 10/0563
See application file for complete search history.

(56) References Cited

U.S. PATENT DOCUMENTS 11,476,505 B2 * 10/2022 Palanisamy ....... H01M 10/4242
11,605,852 B2 *  3/2023 Surampudi ....... H01M 10/6554
(Continued)

FOREIGN PATENT DOCUMENTS

CN        108062429 A      5/2018
CN        111177924 A      5/2020
(Continued)

OTHER PUBLICATIONS

International Search Report Corresponding to International Application No. PCT/CN2023/097220, mailed Jul. 5, 2023.

*Primary Examiner* — Lam S Nguyen
(74) *Attorney, Agent, or Firm* — Yue (Robert) Xu; Apex Attorneys at Law, LLP

(57) ABSTRACT

A method for establishing an electrochemical model for an ion battery is provided. The ion battery includes a negative electrode region, a positive electrode region, and a diaphragm arranged between the negative electrode region and the positive electrode region. The negative electrode region includes a negative electrode current collector, a negative electrode liquid phase and a negative electrode solid phase. The positive electrode region includes a positive electrode current collector, a positive electrode liquid phase and a positive electrode solid phase. The method includes: defining negative electrode parameters for describing a solid-liquid interface structure between the negative electrode liquid phase and the negative electrode solid phase in the negative electrode region and positive electrode parameters for describing a solid-liquid interface structure between the positive electrode liquid phase and the positive electrode solid phase in the positive electrode region; establishing a partial differential equation set and a boundary condition for describing a charging process and a discharging process of the ion battery based on the negative electrode parameters and the positive electrode parameters; and solving the partial differential equation set to establish the electrochemical
(Continued)

model for the ion battery. Each of the solid-liquid interface structure in the negative electrode region and the solid-liquid interface structure in the positive electrode region is a folded structure, and includes multiple repeated folded substructures.

8 Claims, 2 Drawing Sheets

(51) Int. Cl.
    *H01M 4/66*     (2006.01)
    *H01M 10/0525*     (2010.01)
    *H01M 10/0563*     (2010.01)
    *H01M 10/0583*     (2010.01)

(52) U.S. Cl.
    CPC ... *H01M 10/0525* (2013.01); *H01M 10/0563* (2013.01); *H01M 10/0583* (2013.01)

(56) References Cited

U.S. PATENT DOCUMENTS

| | | | |
|---|---|---|---|
| 2003/0091898 A1 | 5/2003 | Dexter et al. | |
| 2017/0025646 A1* | 1/2017 | Ota | H01M 10/049 |
| 2022/0187375 A1* | 6/2022 | Niu | G01R 31/367 |

FOREIGN PATENT DOCUMENTS

| | | |
|---|---|---|
| CN | 113419188 A | 9/2021 |
| CN | 114611319 A | 6/2022 |
| CN | 115064227 | 9/2022 |

* cited by examiner

```
┌─────────────────────────────────────────────────────────────────┐
│   Define negative electrode parameters for describing a solid-liquid interface │
│ structure in a negative electrode and positive electrode parameters for describing │─── S101
│          a solid-liquid interface structure in a positive electrode              │
└─────────────────────────────────────────────────────────────────┘
                                    │
                                    ▼
┌─────────────────────────────────────────────────────────────────┐
│    Establish a partial differential equation set and a boundary condition for    │
│ describing a charging process and a discharging process of an ion battery based  │─── S102
│     on the negative electrode parameters and the positive electrode parameters   │
└─────────────────────────────────────────────────────────────────┘
                                    │
                                    ▼
┌─────────────────────────────────────────────────────────────────┐
│  Solve the partial differential equation set to establish an electrochemical model │─── S103
│                            for the ion battery                                    │
└─────────────────────────────────────────────────────────────────┘
```

Figure 1

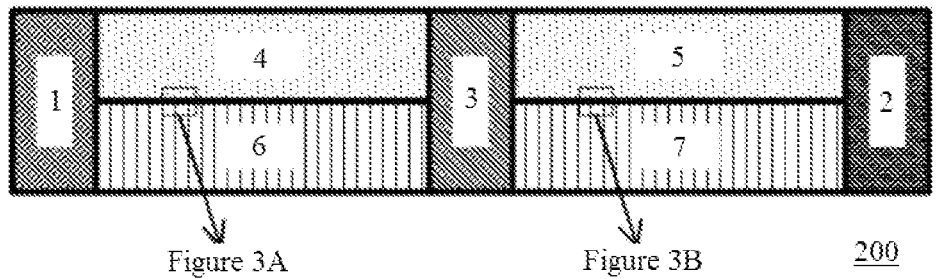

METHOD FOR ESTABLISHING ELECTROCHEMICAL MODEL FOR ION BATTERY

CROSS-REFERENCE TO RELATED APPLICATION

This application is a U.S. National Stage Entry of PCT/CN2023/097220, filed May 30, 2023, which claims priority to Chinese Patent Application No. 202210727081.X filed Jun. 24, 2022, which is incorporated herein by reference in its entirety.

TECHNICAL FIELD

The present disclosure relates to the technical field of ion batteries, and in particular to a method for establishing an electrochemical model for an ion battery.

BACKGROUND

Presently, rechargeable batteries with high energy density and using non aqueous electrolyte solutions, such as ion batteries, have been widely used in a series of applications. The applications may include power sources for automobiles, ships, and other means of transportation, household and uninterruptible power sources, storing electricity generated by intermittent and renewable sources for use in household and grid connected power networks for power requirements and load balancing, and the like.

In these applications, the requirements for estimating and warning the state of ion batteries, including parameters such as state of charge (SOC), state of health (SOH), state of power (SOP) and state of safety (SOS), are increasing. In the conventional battery management systems (BMS) and the cloud computing technologies, the method for calculating the state of ion batteries is performed based on an equivalent circuit model of ion batteries. However, the equivalent circuit model of ion batteries has inherent drawbacks, including low accuracy and inability to explain the mechanism of ion battery faults, resulting in limited effectiveness of the equivalent circuit model in estimating state of the next generation of batteries.

Therefore, it is required to propose a mathematical model close to the true electrochemical mechanism of ion batteries. At present, the models constructed for the electrochemical mechanisms of ion batteries include single particle models (SPM), pseudo two-dimensional models (P2D), and the like. However, these electrochemical models still have some shortcomings. For example, the SPM model is only suitable for lower charge discharge rates, and the computational complexity of the P2D model is too high, resulting in that the P2D model is unsuitable for practical applications.

SUMMARY

In order to solve the above problems in the conventional technology, a method for establishing an electrochemical model for an ion battery is provided according to the present disclosure, balancing the accuracy and the speed in calculating the state of the battery and suitable for calculating the state of the ion battery such as a lithium-ion battery and a sodium ion battery.

A brief overview of the present disclosure is provided below to provide a basic understanding of some aspects of the present disclosure. It should be understood that this overview is not an exhaustive overview of the present disclosure, is not intended to determine key or important parts of the present disclosure or limit the scope of the present disclosure. The overview is provided to provide certain concepts in a simplified form as a prelude to a more detailed description to be discussed later.

In order to achieve the above purpose of the present disclosure, a method for establishing an electrochemical model for an ion battery is provided according to an aspect of the present disclosure. The ion battery includes a negative electrode region, a positive electrode region, and a diaphragm arranged between the negative electrode region and the positive electrode region. The negative electrode region includes a negative electrode current collector, a negative electrode liquid phase and a negative electrode solid phase. The positive electrode region includes a positive electrode current collector, a positive electrode liquid phase and a positive electrode solid phase. The method includes: defining negative electrode parameters for describing a solid-liquid interface structure between the negative electrode liquid phase and the negative electrode solid phase in the negative electrode region and positive electrode parameters for describing a solid-liquid interface structure between the positive electrode liquid phase and the positive electrode solid phase in the positive electrode region; establishing a partial differential equation set and a boundary condition for describing a charging process and a discharging process of the ion battery based on the negative electrode parameters and the positive electrode parameters; and solving the partial differential equation set to establish the electrochemical model for the ion battery. Each of the solid-liquid interface structure in the negative electrode region and the solid-liquid interface structure in the positive electrode region is a folded structure, and includes multiple repeated folded substructures.

According to an embodiment of the present disclosure, the negative electrode parameters include a parameter for describing a surface area between the negative electrode liquid phase and the negative electrode solid phase and a parameter for describing a diffusion depth of ions in the negative electrode solid phase; and the positive electrode parameters include a parameter for describing a surface area between the positive electrode liquid phase and the positive electrode solid phase and a parameter for describing a diffusion depth of ions in the positive electrode solid phase.

According to an embodiment of the present disclosure, the parameter for describing the surface area between the negative electrode liquid phase and the negative electrode solid phase includes a width of a liquid phase folded structure and a depth of a solid phase folded structure in the solid-liquid interface folded structure in the negative electrode region; and the parameter for describing the surface area between the positive electrode liquid phase and the positive electrode solid phase includes a width of a liquid phase folded structure and a depth of a solid phase folded structure in the solid-liquid interface folded structure in the positive electrode region.

According to an embodiment of the present disclosure, the parameter for describing the diffusion depth of ions in the negative electrode solid phase includes a width of a solid phase folded structure in the solid-liquid interface folded structure in the negative electrode region; and the parameter for describing the diffusion depth of ions in the positive electrode solid phase includes a width of a solid phase folded structure in the solid-liquid interface folded structure in the positive electrode region.

According to an embodiment of the present disclosure, in the solid-liquid interface folded structure in the negative electrode region, a width of a liquid phase folded structure of a folded substructure is the same or different from a width of a liquid phase folded structure of a folded substructure adjacent to the folded substructure, and a width of a solid phase folded structure of the folded substructure is the same or different from a width of a solid phase folded structure of the folded substructure adjacent to the folded substructure; and in the solid-liquid interface folded structure in the positive electrode region, a width of a liquid phase folded structure of a folded substructure is the same or different from a width of a liquid phase folded structure of a folded substructure adjacent to the folded substructure, and a width of a solid phase folded structure of the folded substructure is the same or different from a width of a solid phase folded structure of the folded substructure adjacent to the folded substructure.

According to an embodiment of the present disclosure, in the solid-liquid interface folded structure in the negative electrode region, a depth of a solid phase folded structure of a folded substructure is the same or different from a depth of a solid phase folded structure of a folded substructure adjacent to the folded substructure; and in the solid-liquid interface folded structure in the positive electrode region, a depth of a solid phase folded structure of a folded substructure is the same or different from a depth of a solid phase folded structure of a folded substructure adjacent to the folded substructure.

According to an embodiment of the present disclosure, ions in the ion battery are lithium ions. The negative electrode current collector is copper foil, the negative electrode liquid phase is a carbonate solvent dissolved in lithium hexafluorophosphate as an electrolyte, and the negative electrode solid phase is graphite. The positive electrode current collector is aluminum foil, the positive electrode liquid phase is a carbonate solvent dissolved in lithium hexafluorophosphate as an electrolyte, and the positive electrode solid phase is lithium manganate or lithium cobalt oxide.

According to an embodiment of the present disclosure, each of the negative electrode solid phase and the positive electrode solid phase further includes a conductive adhesive.

In the method for establishing an electrochemical model for an ion battery according to the present disclosure, the liquid phase and the solid phase in the ion battery are separated and modeled separately, simplifying the description of the electrochemical mechanism of the ion battery and facilitating the calculation of the state parameters of the ion battery. Furthermore, with the method for establishing an electrochemical model for an ion battery according to the present disclosure, it is avoided to perform the calculation of spherical coordinates in the P2D model, thereby ensuring calculation accuracy while greatly reducing computational complexity.

BRIEF DESCRIPTION OF THE DRAWINGS

Referring to the descriptions of the embodiments of the present disclosure in conjunction with the accompanying drawings below, it is easy to understand the above and other purposes, features, and advantages of the present disclosure.

FIG. 1 shows a flow chart of a method for establishing an electrochemical model for an ion battery according to an embodiment of the present disclosure;

FIG. 2 shows a schematic diagram of a configuration of an ion battery according to an embodiment of the present disclosure;

DETAILED DESCRIPTION OF THE EMBODIMENTS

Figure 3A:
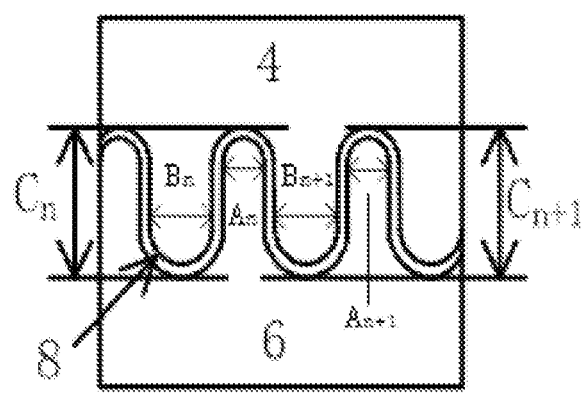
FIG. 3A shows a schematic diagram of a solid-liquid interface structure, that is partially amplified, between a negative electrode liquid phase and a negative electrode solid phase in a negative electrode region of an ion battery according to an embodiment of the present disclosure.

In the following descriptions, some embodiments of the present disclosure are described in detail with reference to the accompanying explanatory diagrams. Reference numerals are used to indicate elements in the drawings. Although the same elements are shown in different drawings, the same elements are represented by the same reference numerals. In addition, in the following descriptions of the present disclosure, detailed descriptions of the known functions and configurations incorporated herein are omitted in cases where the subject matter of the present disclosure may be unclear.

The terms in this specification are only used for describing specific embodiments and are not intended to limit the present disclosure. As used in this specification, unless the context otherwise indicates, the singular form is intended to include the plural form. It should be understood that the terms "including", "comprising", and "having" used in the specification are intended to specifically describe the existence of the stated features, entities, operations, and/or components, but do not exclude the existence or addition of one or more other features, entities, operations, and/or components.

Unless otherwise defined, all terms, including terms technical and scientific terms, used in this specification have the same meanings as those commonly understood by those skilled in the art to which the present disclosure belongs. It should be further understood that terms such as those defined in commonly used dictionaries should be interpreted as having meanings consistent with their meanings in the context of the relevant field, and should not be interpreted in an idealized or overly formal sense unless explicitly defined herein.

In the following description, many specific details are described to provide a comprehensive understanding of the present disclosure. The present disclosure may be implemented without some or all of these specific details. In other embodiments, in order to avoid blurring the present disclosure due to unnecessary details, only components closely related to the solutions according to the present disclosure are shown in the accompanying drawings, while other details that are not closely related to the present disclosure are omitted.

Hereinafter, a method for establishing an electrochemical model for an ion battery according to the embodiments of the present disclosure is described in detail with reference to the accompanying drawings.

FIG. 1 shows a flow chart of a method 100 for establishing an electrochemical model for an ion battery according to an embodiment of the present disclosure. FIG. 2 shows a schematic diagram of a configuration of an ion battery 200 according to an embodiment of the present disclosure.

As shown in FIG. 2, the ion battery 200 according to the embodiment of the present disclosure may include a negative electrode region, a positive electrode region, and a diaphragm 3 arranged between the negative electrode region and the positive electrode region. According to an embodiment of the present disclosure, the negative electrode region may include a negative electrode current collector 1, a negative electrode liquid phase 4 and a negative electrode solid phase 6, and the positive electrode region may include a positive electrode current collector 2, a positive electrode liquid phase 5 and a positive electrode solid phase 7.

According to an embodiment of the present disclosure, the ion battery 200 may be a lithium-ion battery, that is, the ions used as charge carriers in the ion battery 200 are lithium ions. It should be understood by those skilled in the art that although the embodiments of the present disclosure are described with a lithium-ion battery as an example, the present disclosure is not limited to the lithium-ion battery. The concept of the present disclosure may also be applied to ion batteries with other ions, such as a sodium ion battery, and all these variants should be within the scope of the present disclosure.

According to an embodiment of the present disclosure, in the ion battery 200 which is a lithium-ion battery, the negative electrode current collector 1 may be copper foil, the negative electrode liquid phase 4 may be a carbonate solvent dissolved in lithium hexafluorophosphate as an electrolyte, and the negative electrode solid phase 6 may be graphite. According to an embodiment of the present disclosure, in the ion battery 200 which is a lithium-ion battery, the positive electrode current collector 2 may be aluminum foil, the positive electrode liquid phase 5 may be a carbonate solvent dissolved in lithium hexafluorophosphate as an electrolyte, and the positive electrode solid phase 7 may be lithium manganate or lithium cobalt oxide.

In addition, according to an embodiment of the present disclosure, in the ion battery 200, each of the negative electrode solid phase 6 and the positive electrode solid phase 7 may further includes a conductive adhesive.

According to an embodiment of the present disclosure, in the ion battery 200, the negative electrode solid phase 6 may be tightly connected to the negative electrode current collector 1 through a conductive adhesive and an adhesive, so that electrons may freely move between the negative electrode current collector 1 and the negative electrode solid phase 6. In addition, according to an embodiment of the present disclosure, in the ion battery 200, the positive electrode solid phase 7 may be tightly connected to the positive electrode current collector 2 through a conductive adhesive and an adhesive, so that electrons may freely move between the positive electrode current collector 2 and the positive electrode solid phase 7.

However, according to an embodiment of the present disclosure, in the ion battery 200, electrons cannot directly enter the negative electrode liquid phase 4 and the positive electrode liquid phase 5. According to an embodiment of the present disclosure, ions (such as lithium ions) may move between the negative electrode liquid phase 4 and the positive electrode liquid phase 5, or ions may move through the diaphragm 3 from the negative electrode liquid phase 4 to the positive electrode liquid phase 5 or from the positive electrode liquid phase 5 to the negative electrode liquid phase 4.

In addition, according to an embodiment of the present disclosure, in the ion battery 200, a length of the negative electrode liquid phase 4 is same as a length of the negative electrode solid phase 6 in a horizontal direction, both of which are equal to a material thickness of the negative electrode solid phase 6. The material thickness of the negative electrode solid phase 6 is equal to a distance from the negative electrode current collector 1 to the diaphragm 3. According to an embodiment of the present disclosure, in the ion battery 200, a length of the positive electrode liquid phase 5 is same as a length of the positive electrode solid phase 7, both of which are equal to a material thickness of the positive electrode solid phase 7. The material thickness of the positive electrode solid phase 7 is equal to a distance from the positive electrode current collector 2 to the diaphragm 3.

Those skilled in the art should know that although the configuration structure of the ion battery shown in FIG. 2 is used as an example to describe the embodiments of the present disclosure, the present disclosure is not limited to the above descriptions. The concept of the present disclosure may also be applied to an ion battery with other configuration structures as long as a solid-liquid interface structure as shown in FIG. 3A is arranged in a negative electrode region of the ion battery and a solid-liquid interface structure as shown in FIG. 3B is arranged in a positive electrode region of the ion battery, and all the variants should be within the scope of the present disclosure.

Figure 3B:
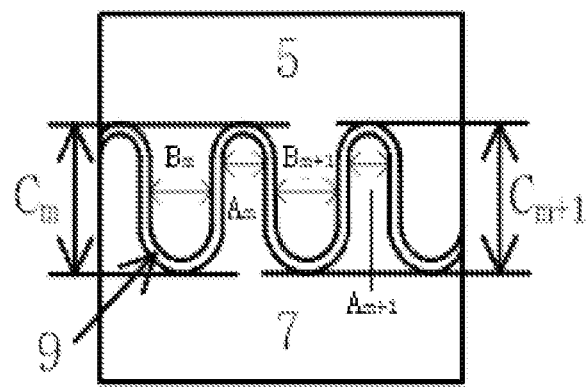
FIG. 3B shows a schematic diagram of a solid-liquid interface structure, that is partially amplified, between a positive electrode liquid phase and a positive electrode solid phase in a positive electrode region of an ion battery according to an embodiment of the present disclosure.

Further, FIG. 3A shows a schematic diagram of a solid-liquid interface structure 8, that is partially amplified, between a negative electrode liquid phase 4 and a negative electrode solid phase 6 in the negative electrode region of the ion battery 200 according to an embodiment of the present disclosure, and FIG. 3B shows a schematic diagram of a solid-liquid interface structure 9, that is partially amplified, between a positive electrode liquid phase 5 and a positive electrode solid phase 7 in the positive electrode region of the ion battery 200 according to an embodiment of the present disclosure. In this specification, the solid-liquid interface structures in the negative electrode region and the positive electrode region of the ion battery 200 may be referred to as Solid Electrolyte Interfaces (SEIs).

As shown in FIGS. 3A and 3B, according to an embodiment of the present disclosure, in the ion battery 200, each of the solid-liquid interface structure 8 in the negative electrode region and the solid-liquid interface structure 9 in the positive electrode region may be modeled as a folded structure, which includes multiple repeated folded substructures. Therefore, in this specification, the solid-liquid interface structure 8 in the negative electrode region may be referred to as a solid-liquid interface folded structure 8, and the solid-liquid interface structure 9 in the positive electrode region may be referred to as a solid-liquid interface folded structure 9.

As shown in FIG. 1, according to an embodiment of the present disclosure, the method 100 for establishing an electrochemical model for an ion battery may include the following steps S101 to S103.

In step S101, negative electrode parameters for describing a solid-liquid interface structure 8 between the negative electrode liquid phase 4 and the negative electrode solid phase 6 in the negative electrode region and positive electrode parameters for describing a solid-liquid interface structure 9 between the positive electrode liquid phase 6 and the positive electrode solid phase 7 in the positive electrode region are defined.

In step S102, a partial differential equation set and a boundary condition for describing a charging process and a discharging process of the ion battery 200 are established based on the negative electrode parameters and the positive electrode parameters.

In step S103, the partial differential equation set is solved to establish the electrochemical model for the ion battery.

Hereinafter, the steps S101 to S103 are described in detail in conjunction with the embodiments shown in FIG. 3A, FIG. 3B and FIG. 4.

As shown in FIG. 3A, according to an embodiment of the present disclosure, the negative electrode parameters in step S101 may include: a parameter for describing a surface area between the negative electrode liquid phase 4 and the negative electrode solid phase 6 (that is, a surface area parameter of the solid-liquid interface structure 8 shown in FIG. 3A) and a parameter for describing a diffusion depth of ions in the negative electrode solid phase 6.

Specifically, as shown in FIG. 3A, according to an embodiment of the present disclosure, the parameter for describing the surface area between the negative electrode liquid phase 4 and the negative electrode solid phase 6 includes a width $B_n$ of a liquid phase folded and a depth Cn of a solid phase folded structure in the solid-liquid interface folded structure 8 in the negative electrode region. In addition, as shown in FIG. 3A, according to an embodiment of the present disclosure, the parameter for describing the diffusion depth of ions in the negative electrode solid phase 6 in the negative electrode region may include a width $A_n$ of a solid phase folded structure in the solid-liquid interface folded structure 8 in the negative electrode region.

For the negative electrode parameters $A_n$, $B_n$ and $C_n$, $1 \leq n \leq N$, where N represents the number of folded substructures in the solid-liquid interface folded structure 8 in the negative electrode region.

According to an embodiment of the present disclosure, a folded substructure may be defined to include a liquid phase folded structure and a solid phase folded structure. For example, FIG. 3A shows two folded substructures in the solid-liquid interface folded structure 8 in the negative electrode region, that is, an n-th folded substructure described by negative electrode parameters $A_n$, $B_n$ and $C_n$ and an (n+1) th folded substructure that is adjacent to the n-th folded substructure and described by negative electrode parameters $A_{n+1}$, $B_{n+1}$ and $C_{n+1}$.

According to an embodiment of the present disclosure, in the solid-liquid interface folded structure 8 in the negative electrode region, a width of a liquid phase folded structure of a folded substructure may be the same or different from a width of a liquid phase folded structure of a folded substructure adjacent to the folded substructure, and a width of a solid phase folded structure of the folded substructure may be the same or different from a width of a solid phase folded structure of the folded substructure adjacent to the folded substructure. That is, as shown in FIG. 3A, the negative electrode parameter $B_n$ in the n-th folded substructure may be the same or different from the negative electrode parameter $B_{n+1}$ in the (n+1) th folded substructure, and the negative electrode parameter $A_n$ in the n-th folded substructure may be the same or different from the negative electrode parameter $A_{n+1}$ in the (n+1) th folded substructure.

In addition, according to an embodiment of the present disclosure, in the solid-liquid interface folded structure 8 in the negative electrode region, a depth of a solid phase folded structure of a folded substructure may be the same or different from a depth of a solid phase folded structure of a folded substructure adjacent to the folded substructure. That is, as shown in FIG. 3A, the negative electrode parameter $C_n$ in the n-th folded substructure may be the same or different from the negative electrode parameter $C_{n+1}$ in the (n+1) th folded substructure.

As shown in FIG. 3B, according to an embodiment of the present disclosure, the positive electrode parameters in step S101 may include: a parameter for describing a surface area between the positive electrode liquid phase 5 and the positive electrode solid phase 7 (that is, a surface area parameter of the solid-liquid interface structure 9 shown in FIG. 3B) and a parameter for describing a diffusion depth of ions in the positive electrode solid phase 7.

Specifically, as shown in FIG. 3B, according to an embodiment of the present disclosure, the parameter for describing the surface area between the positive electrode liquid phase 5 and the positive electrode solid phase 7 includes a width $B_m$ of a liquid phase folded and a depth $C_m$ of a solid phase folded structure in the solid-liquid interface folded structure 9 in the positive electrode region. In addition, as shown in FIG. 3B, according to an embodiment of the present disclosure, the parameter for describing the diffusion depth of ions in the positive electrode solid phase 7 in the positive electrode region may include a width $A_m$ of a solid phase folded structure in the solid-liquid interface folded structure 9 in the positive electrode region.

For the positive electrode parameters $A_m$, $B_m$ and $C_m$, $1 \leq m \leq N$, where M represents the number of folded substructures in the solid-liquid interface folded structure 9 in the positive electrode region.

For example, FIG. 3B shows two folded substructures in the solid-liquid interface folded structure 9 in the positive electrode region, that is, an m-th folded substructure described by positive electrode parameters $A_m$, $B_m$ and $C_m$ and an (m+1) th folded substructure that is adjacent to the m-th folded substructure and described by positive electrode parameters $A_{m+1}$, $B_{m+1}$ and $C_{m+1}$.

According to an embodiment of the present disclosure, in the solid-liquid interface folded structure 9 in the positive electrode region, a width of a liquid phase folded structure of a folded substructure may be the same or different from a width of a liquid phase folded structure of a folded substructure adjacent to the folded substructure, and a width of a solid phase folded structure of the folded substructure may be the same or different from a width of a solid phase folded structure of the folded substructure adjacent to the folded substructure. That is, as shown in FIG. 3A, the positive electrode parameter $B_m$ in the m-th folded substructure may be the same or different from the positive electrode parameter $B_{m+1}$ in the (m+1) th folded substructure, and the positive electrode parameter $A_m$ in the m-th folded substructure may be the same or different from the positive electrode parameter $A_{m+1}$ in the (m+1) th folded substructure.

In addition, according to an embodiment of the present disclosure, in the solid-liquid interface folded structure 9 in the positive electrode region, a depth of a solid phase folded structure of a folded substructure may be the same or different from a depth of a solid phase folded structure of a folded substructure adjacent to the folded substructure. That is, as shown in FIG. 3B, the positive electrode parameter $C_m$ in the m-th folded substructure may be the same or different from the positive electrode parameter $C_{m+1}$ in the (m+1) th folded substructure.

In fact, in the ion battery 200, both the solid-liquid interface structure 8 in the negative electrode region and the solid-liquid interface structure 9 in the positive electrode region are complex. In the above embodiments of the present disclosure, the solid-liquid interface structure 8 in the negative electrode region and the solid-liquid interface structure 9 in the positive electrode region are modeled with folded structures, so that the solid phase and the liquid phase are separated from each other in the electrochemical modeling process of the ion battery 200, thereby reducing the computational complexity in the modeling process and improving the flexibility and intuitiveness of the electrochemical model.

According to the above embodiments of the present disclosure, a large surface area may be obtained by unfolding the solid-liquid interface folding structure 8 in the negative electrode region and the solid-liquid interface folding structure 9 in the positive electrode region, corresponding to an actual electrochemical process of embedding and de embedding ions through a sufficiently large surface between a solid phase and a liquid phase in a real ion battery. Those skilled in the art should understand that although the solid-liquid interface structure configured with two folded substructures shown in FIG. 2 is used as an example to describe the embodiments of the present disclosure, the present disclosure is not limited to the above solid-liquid interface structure. The concept of the present disclosure may be applied to a modeling method for approximating a solid-liquid interface structure with other folding configurations, and all these variants are within the scope of the present disclosure.

According to the above embodiments of the present disclosure, the surface area of the solid-liquid interface structure in the negative electrode region may be adjusted by adjusting the negative electrode parameter $C_n$, and the surface area of the solid-liquid interface structure in the positive electrode region may be adjusted by adjusting the positive electrode parameter $C_m$. In addition, according to an embodiment of the present disclosure, the surface area of the solid-liquid interface structure in the negative electrode region may be further adjusted by adjusting the negative electrode parameter $B_n$, and the surface area of the solid-liquid interface structure in the positive electrode region may be further adjusted by adjusting the positive electrode parameter $B_m$. In addition, according to an embodiment of the present disclosure, the diffusion depth of ions in the solid phase in the negative electrode region may be adjusted by adjusting the negative electrode parameter $A_n$ and the diffusion depth of ions in the solid phase in the positive electrode region may be adjusted by adjusting the positive electrode parameter $A_m$. That is, a concentration of the ions embedded in the solid phase may be adjusted.

According to an embodiment of the present disclosure, in step S102, a partial differential equation set and a boundary condition for describing a charging process and a discharging process of the ion battery 200 are established based on the negative electrode parameters $A_n$, $B_n$ and $C_n$ and the positive electrode parameters $A_m$, $B_m$ and $C_m$ obtained in step S101.

Figure 4:
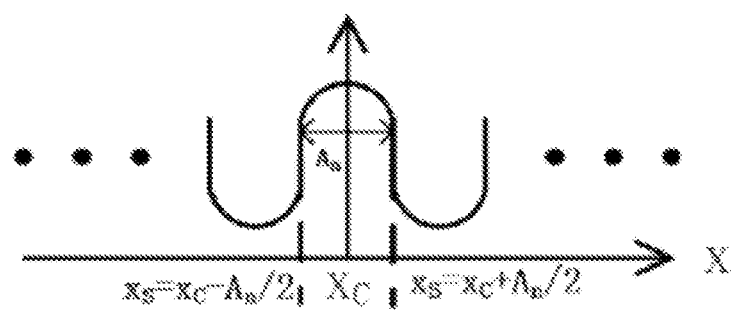
FIG. 4 shows a schematic diagram of a solid-liquid interface structure used for establishing a partial differential equation set and a boundary condition for describing a charging process and a discharging process of an ion battery according to an embodiment of the present disclosure.

FIG. 4 shows a schematic diagram of a solid-liquid interface structure used for establishing a partial differential equation set and a boundary condition for describing a charging process and a discharging process of an ion battery according to an embodiment of the present disclosure.

According to an embodiment of the present disclosure, in the charging process of the ion battery 200, ions pass through the solid-liquid interface structure 9 from the positive electrode solid phase 7 in the positive electrode region and then are detached into the positive electrode liquid phase 5. Then, ions in the positive electrode liquid phase 5 pass through the diaphragm 3 and reach the negative electrode liquid phase 4 in the negative electrode region. Then, the ions in the negative electrode liquid phase 4 pass through the solid-liquid interface structure 8 in the negative electrode region and are embedded in the negative electrode solid phase 6. Simultaneously, electrons move from the positive electrode solid phase 7 in the positive electrode region to the positive electrode current collector 2, then enter the negative electrode current collector 1 in the negative electrode region through an external charging device, and then enter the negative electrode solid phase 6 to cooperate with the embedded ions to achieve electrical neutrality. Thus, the charging process of the ion battery 200 is performed.

In addition, according to an embodiment of the present disclosure, in the discharging process of the ion battery 200), ions pass through the solid-liquid interface structure 8 from the negative electrode solid phase 6 in the negative electrode region and then are detached into the negative electrode liquid phase 4. Then, lithium ions in the negative electrode liquid phase 4 pass through the diaphragm 3 and reach the positive electrode liquid phase 5 in the positive electrode region. Then, ions in the positive electrode liquid phase 5 pass through the solid-liquid interface structure 9 in the positive electrode region and are embedded into the positive electrode solid phase 7. Simultaneously, electrons move from the negative electrode solid phase 6 in the negative electrode region to the negative electrode current collector 1, then enter the positive electrode current collector 2 in the positive electrode region through an external load, and then enter the positive electrode solid phase 7 to cooperate with the embedded ions to achieve electrical neutrality. Thus, the discharging process of the ion battery 200 is performed.

Since the charging process and the discharging process of the ion battery 200 are known to those skilled in the art, for the sake of brevity, the charging process and the discharging process of the ion battery 200 are not described in detail in the present disclosure.

The charging process and the discharging process of the ion battery 200 may be described based on a partial differential equation and a boundary condition thereof.

Specifically, according to an embodiment of the present disclosure, a partial differential equation for a mass transfer in a solid phase may be expressed as:

$$\frac{\partial c_s^{\pm}(x, t)}{\partial t} = \frac{\partial}{\partial x}\left\{D_s^{\pm}\frac{\partial c_s^{\pm}}{\partial x}(x, t)\right\} \quad (1)$$

where t represents time, x represents a one-dimensional spatial scale, $c_s^{\pm}$ represent an ion concentration in a solid phase of a positive electrode (+) and an ion concentration in a solid phase of a negative electrode (−), and $D_s^{\pm}$ represents an effective diffusion coefficient of the ion concentration in the solid phase of the positive electrode and an effective diffusion coefficient of the ion concentration in the solid phase of the negative electrode.

According to an embodiment of the present disclosure, a boundary condition of the partial differential equation shown in the above equation (1) may be expressed as:

$$\frac{\partial c_s^{\pm}}{\partial x}\bigg|_{x=x_c} \quad (2)$$

$$D_s^{\pm}\frac{\partial c_s^{\pm}}{\partial x}\bigg|_{x=x_s}$$

where $j_n^{\pm}$ represents a molar flux of electrochemical ions (such as lithium ions), $x_C$ represents a center point of a width of a solid phase folded structure (such as a center point of a width of an n-th solid phase folded structure in a negative electrode region), and $x_S$ represents a lateral position of the solid-phase folded structure (which is calculated as shown in FIG. 4).

Those skilled in the art should understand that although FIG. 4 shows the configuration of $x_C$ and $x_S$ with the n-th solid phase folded structure of the negative electrode region as an example, for calculation in a positive electrode region, a boundary condition for the positive electrode region may be obtained with a dividing point determined as a center point of a solid phase folded structure in the positive electrode region.

Further, referring to FIG. 3A and FIG. 4, for the n-th solid phase folded structure and the (n+1) th solid phase folded structure in the negative electrode region, a distance between a center points $x_C$ of the n-th solid phase folded structure and a center points $x_C$ of the (n+1) th solid phase folded structure may be expressed as $A_n/2+B_{n+1}+A_{n+1}/2$. That is, the distance between the center points $x_C$ of two adjacent solid phase folded structures in the negative electrode region is determined by the parameters $A_n$ and $B_n$ of the two adjacent solid phase folded structures. Similarly, a distance between center points $x_C$ of two adjacent solid phase folded structures in the positive electrode region may be calculated in a similar manner.

In addition, according to an embodiment of the present disclosure, a partial differential equation set of electric potential in a solid phase may be expressed as:

$$\frac{\partial \phi_s^{\pm}(x,t)}{\partial x} = -\frac{I(t) - i_e(x,t)}{\sigma^{eff}} \quad (3)$$

$$\frac{\partial}{\partial x}\left[\sigma^{eff}\frac{\partial \phi_s^{\pm}(x,t)}{\partial x}\right] - a^{\pm}Fj_n^{\pm}(x,t) = 0$$

where $\phi_s^{\pm}$ represents a solid phase electric potential of a positive electrode region and a negative electrode region, I (t) represents an operation current density of a ion battery, $i_e$ represents a current density in a liquid phase, $\sigma^{eff}$ represents an effective conductivity of a solid phase, $a^{\pm}$ represents effective reaction area per unit volume of the positive electrode region and the negative electrode region, and F represents a Faraday constant.

$a^{\pm}$ may be expressed as:

$$a^+ = \varepsilon^+ \frac{\frac{\pi}{2}A_m + 2C_m}{\frac{1}{2}\pi\left(\frac{A_m}{2}\right)^2 + A_m C_m} \quad (4)$$

$$a^- = \varepsilon^- \frac{\frac{\pi}{2}A_n + 2C_n}{\frac{1}{2}\pi\left(\frac{A_n}{2}\right)^2 + A_n C_n}$$

where $\varepsilon^{\pm}$ represents solid volume fractions of the positive electrode region and the negative electrode region.

According to an embodiment of the present disclosure, a boundary condition of the partial differential equation set shown in equation (3) may be expressed as:

$$-\sigma^{eff}\frac{\partial \phi_s^{\pm}}{\partial x}\Big|_{x=0} = -\sigma^{eff}\frac{\partial \phi_s^{\pm}}{\partial x}\Big|_{x=L} = I(t) \quad (5)$$

$$\frac{\partial \sigma_s^{\pm}}{\partial x}\Big|_{x=L^-} = \frac{\partial \sigma_s^{\pm}}{\partial x}\Big|_{x=L^+} = 0$$

In the above equation (5), in a case that $x=L^-$, an interface between a negative electrode solid phase and a diaphragm, that is the interface between the negative electrode solid phase 6 and the diaphragm 3 shown in FIG. 2, is expressed; in a case that $x=L^+$, an interface between a positive electrode solid phase and a diaphragm, that is the interface between the positive electrode solid phase 7 and the diaphragm 3 shown in FIG. 2, is expressed; in a case that $x=0$, an interface between a negative electrode current collector and a negative electrode solid phase, that is the interface between the negative electrode current collector 1 and the negative electrode solid phase 6 shown in FIG. 2, is expressed; and in a case that $x=L$, an interface between a positive electrode current collector and a positive electrode solid phase, that is the interface between the positive electrode current collector 2 and the positive electrode solid phase 7 shown in FIG. 2, is expressed.

In addition, according to an embodiment of the present disclosure, a partial differential equation set for a mass transfer in a liquid phase may be expressed as:

$$\frac{\partial C_e(x,t)}{\partial t} = \frac{\partial}{\partial x}D_e^{eff}\left[\frac{\partial C_e(x,t)}{\partial x}\right] + \frac{\partial}{\partial x}\frac{(1-t_+)i_e(x,t)}{F\varepsilon_e} \quad (6)$$

$$\frac{\partial i_e^{\pm}}{\partial x}(x,t) = a^{\pm}Fj_n^{\pm}(x,t)$$

where t represents time, x represents a one-dimensional spatial scale, $C_e$ represent an ion concentration in a liquid phase, $D_e^{eff}$ represents an effective diffusion coefficient of the ion concentration in the liquid phase, $t_+$ represents an electromigration rate, and $\varepsilon_e$ represents a volume fraction of the liquid phase.

According to an embodiment of the present disclosure, a boundary condition of the partial differential equation set shown in the above equation (6) may be expressed as:

$$D_e^{eff}\frac{\partial C_e}{\partial x}(0^{\pm},t) = 0, \quad (7)$$

$$\varepsilon_e(L_e^-)D_e^{eff}(L_e^-)\frac{\partial C_e}{\partial x}(L_e^-,t) = \varepsilon_e(L_{sep}^-)D_e^{eff}(L_{sep}^-)\frac{\partial C_e}{\partial x}(L_{sep}^-,t),$$

$$\varepsilon_e(L_e^+)D_e^{eff}(L_e^+)\frac{\partial C_e}{\partial x}(L_e^+,t) = \varepsilon_e(L_{sep}^+)D_e^{eff}(L_{sep}^+)\frac{\partial C_e}{\partial x}(L_{sep}^+,t),$$

$$C_e(L_e^-,t) = C_e(L_{sep}^-,t),$$

$$C_e(L_e^+,t) = C_e(L_{sep}^+,t)$$

where $0^{\pm}$ represents an interface between a current collector and a positive liquid phase and an interface between a current collector and a negative liquid phase, that is, the interface between the negative current collector 1 and the negative liquid phase 4 and the interface between the positive current collector 2 and the positive liquid phase 5 shown in FIG. 2; $L_e^-$ represents a side, near a negative electrode, of an interface between the negative electrode and a diaphragm; and $L_{sep}^-$ represents a side, near the diaphragm, of the interface between the negative electrode and the diaphragm.

In addition, according to an embodiment of the present disclosure, a partial differential equation of electric potential in a liquid phase may be expressed as:

$$\frac{\partial \Phi_e}{\partial x}(x,t) = \frac{-i_e(x,t)}{\left[\kappa^{eff}(C_e(x,t))\right]} + \frac{2RT}{F}(1-t_+) \times \left[1 + \frac{\partial \ln f_{c/a}}{\partial \ln C_e}\right]\frac{\partial \ln C_e(x,t)}{\partial x} \quad (8)$$

where $\Phi_e$ represents a liquid phase electric potential of a positive electrode and a negative electrode, $\kappa^{eff}$ represents an effective conductivity of a liquid phase (such as electrolyte), R represents an universal gas constant, T represents a temperature, and $f_{c/a}$ represents an average molar activity coefficient of the liquid phase.

According to an embodiment of the present disclosure, a boundary condition of the partial differential equation shown in equation (8) may be expressed as:

$$\Phi_e(L_e^-, t) = \Phi_e(L_{sep}^-, t), \quad (9)$$

$$\Phi_e(L_e^+, t) = \Phi_e(L_{sep}^+, t)$$

In addition, according to an embodiment of the present disclosure, a partial differential equation set for a mass transfer in a diaphragm may be expressed as:

$$\frac{\partial C_e(x,t)}{\partial t} = \frac{\partial}{\partial x}D_e^{eff}\left[\frac{\partial C_e(x,t)}{\partial x}\right] - \frac{\partial}{\partial x}\frac{i_+ i_e(x,t)}{F\varepsilon_e} \quad (10)$$

According to an embodiment of the present disclosure, a boundary condition of the partial differential equation set shown in the above equation (10) may be the same as the boundary condition of the partial differential equation set for the mass transfer in the liquid phase shown in the above equation (7).

In addition, according to an embodiment of the present disclosure, a partial differential equation of electric potential in a diaphragm may be expressed as:

$$\frac{\partial \Phi_e}{\partial x}(x,t) = \frac{-i_e(x,t)}{\kappa^{eff}(C_e(x,t))} + \frac{2RT}{F}(1-t_+) \times \left[1 + \frac{\partial \ln f_{c/a}}{\partial \ln C_e}\right]\frac{\partial \ln C_e(x,t)}{\partial x} \quad (11)$$

According to an embodiment of the present disclosure, a boundary condition of the partial differential equation shown in the above equation (11) may be the same as the boundary condition of the partial differential equation set for the electric potential in the liquid phase shown in the above equation (9).

In addition, according to an embodiment of the present disclosure, an exchange equation for a solid-liquid interface structure may be expressed as:

$$j_n^\pm(x,t) = \frac{i_n^\pm(x,t)}{F}\left[\exp\left(\frac{\alpha^+ F}{RT}\eta^\pm(x,t)\right) - \exp\left(-\frac{\alpha^- F}{RT}\eta^\pm(x,t)\right)\right] \quad (12)$$

Where $\alpha^+$ represents a reaction conversion coefficient of a positive electrode, $\alpha^-$ represents a reaction conversion coefficient of a negative electrode, $\eta^\pm$ represent overpotentials of the positive electrode and the negative electrode, and $i_0^\pm$ represent reference currents of the positive electrode and the negative electrode.

In addition, according to an embodiment of the present disclosure, an potential closed-loop equation of an ion battery may be expressed as:

$$\phi_s^\pm(x,t) - \phi_e^\pm(x,t) - U^\pm\left[\frac{c_{ss}^\pm(x,t)}{c_{s,max}^\pm}\right] - FR_f^\pm j_n^\pm(x,t) - \eta^\pm(x,t) = 0 \quad (13)$$

where $c_{ss}^\pm$ represent particle surface concentrations of a positive electrode and a negative electrode, $c_{s,max}^\pm$ represent maximum ion concentrations in solid phases of the positive electrode and the negative electrode, $R_f^\pm$ represent diaphragm impedances of the positive electrode and the negative electrode, and $U^\pm$ represent open circuit voltages of the positive electrode and the negative electrode.

Based on the partial differential equations and the boundary conditions shown in the above equations (1) to (13), various parameters, such as an ion concentration, an electric potential, a flux and a voltage, of a solid phase and a liquid phase in a positive electrode and a negative electrode in an ion battery may be obtained.

That is, according to the embodiments of the present disclosure, the partial differential equation set established in step S102 is solved in step S103, thus an electrochemical model of the ion battery 200 may be established, thereby obtaining state information about voltage, current, temperature and the like of the ion battery 200.

According to an embodiment of the present disclosure, the electrochemical model of the ion battery 200 established by using the method 100 may further be applied to predict a service life of an ion battery. For example, the service life of the ion battery 200 may be effectively calculated by adjusting the thickness of the solid-liquid interface structure 8 in the negative electrode region and the solid-liquid interface structure 9 in the positive electrode region.

In addition, according to an embodiment of the present disclosure, the electrochemical model of the ion battery 200 established by using the method 100 may further be applied to predict a safe state of an ion battery. For example, the formation of lithium dendrites may be simulated at the interface between the negative electrode solid phase 6 and the separator 3 in the negative electrode region, and after the lithium dendrites are formed, a short circuit case caused by the lithium dendrites piercing the diaphragm 3 may be simulated and calculated.

In the method for establishing an electrochemical model for an ion battery according to the present disclosure, the liquid phase and the solid phase in the ion battery are separated and modeled separately, simplifying the description of the electrochemical mechanism of the ion battery and facilitating the calculation of the state parameters of the ion battery. Furthermore, with the method for establishing an electrochemical model for an ion battery according to the present disclosure, it is avoided to perform the calculation of spherical coordinates in the P2D model, thereby ensuring calculation accuracy while greatly reducing computational complexity.

Although the present disclosure has been disclosed based on the descriptions of specific embodiments of the present disclosure, it should be understood that those skilled in the art may design various modifications, improvements, or equivalents to the present disclosure within the spirit and scope of the attached claims. These modifications, improvements, or equivalents should fall into the protection scope of the present disclosure.

The invention claimed is:

1. A method for establishing an electrochemical model for an ion battery, wherein the ion battery comprises a negative electrode region, a positive electrode region, and a diaphragm arranged between the negative electrode region and the positive electrode region, the negative electrode region comprises a negative electrode current collector, a negative electrode liquid phase and a negative electrode solid phase, and the positive electrode region comprises a positive electrode current collector, a positive electrode liquid phase and a positive electrode solid phase, wherein the method comprises:
    defining negative electrode parameters for describing a solid-liquid interface structure between the negative electrode liquid phase and the negative electrode solid phase in the negative electrode region and positive electrode parameters for describing a solid-liquid interface structure between the positive electrode liquid phase and the positive electrode solid phase in the positive electrode region;
    establishing a partial differential equation set and a boundary condition for describing a charging process and a discharging process of the ion battery based on the negative electrode parameters and the positive electrode parameters; and
    solving the partial differential equation set to establish the electrochemical model for the ion battery; wherein
    each of the solid-liquid interface structure in the negative electrode region and the solid-liquid interface structure in the positive electrode region is a folded structure and comprises a plurality of repeated folded substructures.

2. The method according to claim 1, wherein
    the negative electrode parameters comprise a parameter for describing a surface area between the negative electrode liquid phase and the negative electrode solid phase and a parameter for describing a diffusion depth of ions in the negative electrode solid phase; and
    the positive electrode parameters comprise a parameter for describing a surface area between the positive electrode liquid phase and the positive electrode solid phase and a parameter for describing a diffusion depth of ions in the positive electrode solid phase.

3. The method according to claim 2, wherein
    the parameter for describing the surface area between the negative electrode liquid phase and the negative electrode solid phase comprises a width of a liquid phase folded structure and a depth of a solid phase folded structure in the solid-liquid interface folded structure in the negative electrode region; and
    the parameter for describing the surface area between the positive electrode liquid phase and the positive electrode solid phase comprises a width of a liquid phase folded structure and a depth of a solid phase folded structure in the solid-liquid interface folded structure in the positive electrode region.

4. The method according to claim 3, wherein
    in the solid-liquid interface folded structure in the negative electrode region, a width of a liquid phase folded structure of a folded substructure is the same or different from a width of a liquid phase folded structure of a folded substructure adjacent to the folded substructure, and a width of a solid phase folded structure of the folded substructure is the same or different from a width of a solid phase folded structure of the folded substructure adjacent to the folded substructure; and
    in the solid-liquid interface folded structure in the positive electrode region, a width of a liquid phase folded structure of a folded substructure is the same or different from a width of a liquid phase folded structure of a folded substructure adjacent to the folded substructure, and a width of a solid phase folded structure of the folded substructure is the same or different from a width of a solid phase folded structure of the folded substructure adjacent to the folded substructure.

5. The method according to claim 2, wherein
    the parameter for describing the diffusion depth of ions in the negative electrode solid phase comprises a width of a solid phase folded structure in the solid-liquid interface folded structure in the negative electrode region; and
    the parameter for describing the diffusion depth of ions in the positive electrode solid phase comprises a width of a solid phase folded structure in the solid-liquid interface folded structure in the positive electrode region.

6. The method according to claim 4, wherein
    in the solid-liquid interface folded structure in the negative electrode region, a depth of a solid phase folded structure of a folded substructure is the same or different from a depth of a solid phase folded structure of a folded substructure adjacent to the folded substructure; and
    in the solid-liquid interface folded structure in the positive electrode region, a depth of a solid phase folded structure of a folded substructure is the same or different from a depth of a solid phase folded structure of a folded substructure adjacent to the folded substructure.

7. The method according to claim 1, wherein
    ions in the ion battery are lithium ions;
    the negative electrode current collector is copper foil, the negative electrode liquid phase is a carbonate solvent dissolved in lithium hexafluorophosphate as an electrolyte, and the negative electrode solid phase is graphite; and
    the positive electrode current collector is aluminum foil, the positive electrode liquid phase is a carbonate solvent dissolved in lithium hexafluorophosphate as an electrolyte, and the positive electrode solid phase is lithium manganate or lithium cobalt oxide.

8. The method according to claim 1, wherein each of the negative electrode solid phase and the positive electrode solid phase further comprises a conductive adhesive.

* * * * *